(12) United States Patent
Banine et al.

(10) Patent No.: US 7,671,965 B2
(45) Date of Patent: Mar. 2, 2010

(54) LITHOGRAPHIC PROJECTION APPARATUS, DEVICE MANUFACTURING METHOD AND DEVICE MANUFACTURED THEREBY

(75) Inventors: Vadim Y. Banine, Helmond (NL); Jeroen Jonkers, Eindhoven (NL)

(73) Assignees: ASML Netherlands B.V., Veldhoven (NL); Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/943,758

(22) Filed: Sep. 4, 2001

(65) Prior Publication Data

US 2002/0051124 A1    May 2, 2002

Related U.S. Application Data

(63) Continuation-in-part of application No. 09/942,953, filed on Aug. 31, 2001, now abandoned.

(30) Foreign Application Priority Data

Sep. 4, 2000    (EP)    .................................. 00307608

(51) Int. Cl.
*G03B 27/42*    (2006.01)
*C23F 1/00*    (2006.01)

(52) U.S. Cl. .............................. 355/53; 355/67; 216/67

(58) Field of Classification Search .............. 250/422.1, 250/504 R; 430/5; 378/34, 35, 119; 359/290; 350/53; 216/67; 355/53, 67
See application file for complete search history.

(56) References Cited

U.S. PATENT DOCUMENTS 5,229,872 A    7/1993    Mumola .................... 359/40

(Continued)

FOREIGN PATENT DOCUMENTS

EP    1 020 897 A1    7/2000

(Continued)

OTHER PUBLICATIONS

Search Report for European Application No. 01307428.1, dated Jan. 7, 2005.

*Primary Examiner*—Lam S Nguyen
(74) *Attorney, Agent, or Firm*—Pillsbury Winthrop Shaw Pittman LLP

(57) ABSTRACT

A lithographic projection apparatus comprising a radiation system for supplying a projection beam of electromagnetic radiation in the extreme ultraviolet (EUV) range, a support structure for supporting patterning structure, the patterning structure serving to pattern the projection beam according to a desired pattern, a substrate table for holding a substrate and a projection system for projecting the patterned beam onto a target portion of the substrate. A space within the apparatus, which space contains a mirror, is supplied with a hydrocarbon gas which forms a protective cap layer on the mirror surface. The partial pressure of the hydrocarbon gas in the space is controlled in response to variations in the background pressure in the space and/or in the reflectivity of the mirror, such that the thickness of the cap layer on the mirror remains within an acceptable range. The partial pressure of hydrocarbon may be increased in order to sputter away the cap layer and/or, if extra multilayers are provided on the mirror, the top layer(s) of the mirror, thus providing a clean mirror surface. The hydrocarbon used may be an alcohol, in which case the cap layer formed is self-terminating.

24 Claims, 1 Drawing Sheet

U.S. PATENT DOCUMENTS

| | | | |
|---|---|---|---|
| 5,296,891 A | 3/1994 | Vogt et al. | 355/67 |
| 5,368,897 A | 11/1994 | Kurihara et al. | 427/450 |
| 5,523,193 A | 6/1996 | Nelson | 430/311 |
| 5,593,800 A * | 1/1997 | Fujioka et al. | 430/5 |
| 5,958,091 A | 9/1999 | Sakai et al. | 48/61 |
| 5,969,441 A | 10/1999 | Loopstra et al. | 310/12 |
| 5,991,360 A * | 11/1999 | Matsui et al. | 378/119 |
| 6,046,792 A | 4/2000 | Van Der Werf et al. | 355/53 |
| 6,198,792 B1 * | 3/2001 | Kanouff et al. | 378/34 |
| 6,304,630 B1 * | 10/2001 | Bisschops et al. | 378/119 |
| 6,421,421 B1 * | 7/2002 | McGeoch | 378/119 |
| 6,469,785 B1 * | 10/2002 | Duveneck et al. | 356/244 |
| 6,533,952 B2 | 3/2003 | Klebanoff et al. | 216/67 |

FOREIGN PATENT DOCUMENTS

| | | |
|---|---|---|
| JP | 2000173893 | 6/2000 |

* cited by examiner

LITHOGRAPHIC PROJECTION APPARATUS, DEVICE MANUFACTURING METHOD AND DEVICE MANUFACTURED THEREBY

RELATED APPLICATIONS

This application is a continuation-in-part of U.S. patent application Ser. No. 09/942,953, which was filed on Aug. 31, 2001, and being abandoned, which also claims the benefit of priority to European Patent Application No. 00307608.0, filed Sep. 4, 2000, the contents of which are herein incorporated by reference.

BACKGROUND OF THE INVENTION

1. Field of the Invention

The present invention relates generally to a lithographic projection apparatus and more particularly to lithographic projection apparatus including a system for maintaining mirror reflectivity.

2. Background of the Related Art

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In the case of the current invention, the projection system will generally consist of an array of mirrors, and the mask will be reflective; see, for example, the apparatus discussed in WO 99/57596. The radiation in this case is preferably electromagnetic radiation in the extreme ultraviolet (EUV) range. Typically, the radiation has a wavelength below about 50 nm, preferably below about 20 nm and most preferably below about 15 nm. An example of a wavelength in the EUV region which is gaining considerable interest in the lithography industry is 13.4 nm, though there are also other promising wavelengths in this region, such as 11 nm, for example.

An example of the radiation system suitable for use with such radiation is described in WO 00/36471. Such a radiation system may comprise a condenser suitable for use with EUV as described in EP 1037113.

The source of EUV radiation is typically a plasma source, for example a laser-produced plasma or a discharge source. The laser-produced plasma source may comprise water droplets, xenon or a solid target which is irradiated by a laser to generate EUV radiation. Examples of suitable laser-produced plasma sources are described in EP 1109427. A discharge source comprises a plasma which is generated by a discharge between two electrodes. Suitable examples of discharge sources include capillary discharge, plasma focus and Z-pinch-type sources, such as for instance those described in co-pending European Patent Application No. 01305671.8.

A common feature of any plasma source is the inherent production of fast ions and atoms, which are expelled from the plasma in all directions. These particles can be damaging to the collector and condenser mirrors which are generally multilayer mirrors, with fragile surfaces. This surface is gradually degraded due to the impact, or sputtering, of the particles expelled from the plasma and the lifetime of the mirrors is thus decreased.

The sputtering effect is particularly problematic for the collector mirror. The purpose of this mirror is to collect radiation which is emitted in all directions by the plasma source and direct it towards other mirrors in the illumination system. The collector mirror is positioned very close to, and in line-of-sight with, the plasma source and therefore receives a large flux of fast particles from the plasma. Other mirrors in the system are generally damaged to a lesser degree by sputtering of particles expelled from the plasma since they may be shielded to some extent.

A measure which has previously been used and which does address the problem of damage to the mirrors, is to reduce the impact of the particle flux on the mirrors using a background gas of helium to impede the particles by collisions. However, this type of technique cannot reduce the sputtering rate to an acceptable level while keeping the background pressure of helium low enough to ensure sufficient transparency to the radiation beam. An alternative method is therefore required to address this problem.

SUMMARY OF THE INVENTION

One aspect of the invention provides a lithographic projection apparatus comprising means for reducing the damage by fast ions, atoms or molecules to the mirrors contained in the radiation system, when the radiation source is a plasma source. It is a further object of the invention to provide a method with which said damage is reduced.

According to one embodiment of the invention there is provided a lithographic projection apparatus including:
  gas supply means for supplying a gaseous hydrocarbon to a space containing a mirror;
  reflectivity sensor means for monitoring the reflectivity of said mirror and/or pressure sensor means for monitoring the background pressure in said space; and
  control means for controlling said gas supply means in response to the reflectivity and/or background pressure measured by said reflectivity and/or pressure sensor means respectively.

It is known that the presence of hydrocarbon molecules in a chamber containing mirrors will lead to a hydrocarbon cap layer forming on the surface of the mirrors. Although this cap layer has previously been used to advantage in protecting mirrors against chemical attack, for example oxidation, the cap layer is frequently seen as disadvantageous since it reduces the reflectivity of the mirror.

The inventors have now discovered that a cap layer on a mirror surface can be used to protect the mirror from sputtering damage caused by fast ions and atoms expelled from a plasma source. Where hydrocarbons are added to a space containing a mirror, they physically or chemically adsorb to the surface of the mirror and thus form a protective layer on the surface. This surface layer is made up of the hydrocarbon molecules and possibly other contaminant particles present in the system as impurities, together with any further molecules which are introduced into the system from the gas supply. When the fast ions and atoms produced by the plasma hit the surface of the mirror, they contact the protective layer thereby dislodging the hydrocarbon molecules from the cap layer, and damage to the mirror surface itself is avoided.

However, if a cap layer is to be used for this purpose, several problems must be overcome. Firstly, the cap layer is gradually destroyed by sputtering and once it has been eroded, damage to the mirror surface will occur. Secondly, if the cap layer is too thick, the reflectivity of the mirror is decreased to an unacceptable level and the efficiency of the projection apparatus is reduced.

In order to overcome these problems, the present inventors have used a dynamic cap layer. This is a cap layer which is continually sputtered away and replaced with further molecules and thus the thickness of the layer remains substantially constant or within an acceptable range. In order to achieve this the reflectivity of the mirror and/or the background pressure of the space are monitored. If the reflectivity of the mirror decreases too much due to the cap layer growing too thick, the pressure of hydrocarbon gas in the space is decreased, thereby allowing part of the cap layer to be sputtered away. The thinner cap layer produced thus provides an increased reflectivity level. Conversely, if the cap layer becomes too thin, holes may be produced in the layer due to sputtering and thus exposing the mirror surface. In this case, the pressure of hydrocarbon gas in the space is increased in order to ensure the cap layer is retained. By careful tuning of the hydrocarbon pressure, a steady state can be achieved whereby the growth of the hydrocarbon cap layer is equal to the destruction of the cap layer due to the plasma particulate emissions.

The present invention therefore provides a lithographic projection apparatus in which the lifetime of the mirrors is prolonged while retaining the efficiency of the system since a high level of reflectivity of the mirrors is retained.

The invention also relates in one aspect to a method of manufacturing a device using a lithographic projection apparatus, the method including:
- providing a substrate that is at least partially covered by a layer of radiation-sensitive material;
- providing a projection beam of radiation using a radiation system;
- using patterning structure to endow the projection beam with a pattern in its cross-section;
- projecting the patterned beam of radiation onto a target portion of the layer of radiation-sensitive material,
- supplying a gaseous hydrocarbon to a space containing a mirror;
- monitoring the reflectivity of said mirror and/or monitoring the background pressure in said space; and
- controlling the amount of gaseous hydrocarbon supplied to said space in response to the reflectivity of said mirror and/or the background pressure of said space.

In an embodiment of the method, the mirror may comprise at least 40 multilayers and the method further comprises the step of adapting the amount of gaseous hydrocarbon supplied to the space such that the top layer(s) of the mirror are removed through sputtering.

The inventors have found that this method, which is based on the control of the thickness of a dynamically growing cap layer, can be used to prolong the lifetime of the mirrors. When this method is used, the thickness of the cap layer which forms on the mirror can be controlled in response to the measured reflectivity of the mirror or the background pressure in the space. For example, once the reflectance of the mirror is too low, the pressure in the chamber is decreased, thus decreasing the thickness of the dynamical cap layer due to a relative increase of the sputtering rate. This has the effect of removing the cap layer and/or the top mirror layer(s) and providing a clean mirror surface. If the multilayer mirror is provided with extra mirror layers, which would not significantly add to the reflectivity, one may even sputter some of its top layers away without significantly deteriorating its reflectivity. Sputtering of the top layers can be carried out several times before the mirror needs to be replaced. In this case it is preferable that the reflectivity of the mirror is monitored and more preferable that both the reflectivity and the background pressure are monitored.

Certain aspects of the present invention therefore provide that mirror lifetimes are increased and that constant and precise monitoring of the pressure of the gases added to the system is not vital.

The invention further relates to a method of manufacturing a device including supplying a gaseous alcohol to a space in said illumination system, which space contains a mirror.

It has previously been found that the introduction of ethanol into a projection apparatus leads to the formation of a self-terminating cap layer on a surface. Thus, once the maximum thickness of the ethanol cap layer is reached, it will not increase over time despite continued application of a partial pressure of ethanol. This has been reported in the context of the protection of projection optics from oxidation due to presence of water and EUV radiation. Alternatively, the thickness of the cap layer is also limited when simultaneous with the introduction of ethanol the mirror is exposed to an oxidizing agent like oxygen, water, etc. In combination with ultraviolet radiation carbon from the cap layer is oxidized and removed from the surface. Eventually only a relatively thin cap layer is formed. However, the present inventors have applied the above described methods to the present invention and found that the use of an alcohol such as ethanol as the hydrocarbon for introduction into the space containing a mirror is particularly advantageous. The alcohol cap layer provides all of the advantages of the present invention, in particular the protection of the mirror surface and the retention of the efficiency of the apparatus due to the reflectivity of the mirror being retained, but also has the advantage that careful monitoring of the background pressure of alcohol is not necessary.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

BRIEF DESCRIPTION OF THE DRAWINGS

The invention and its attendant advantages will be further described below with reference to exemplary embodiments and the accompanying schematic drawings, in which.

In the figures, like parts are described by like references.

In the following description, the invention is described using a reference system of orthoganol X, Y and Z directions.

DETAILED DESCRIPTION

Embodiment 1

Figure 1:
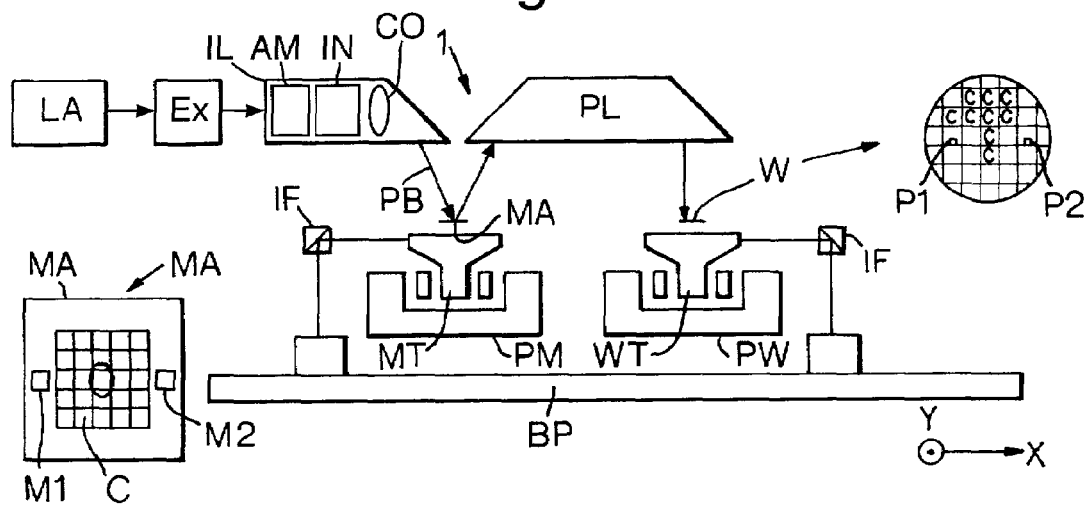
FIG. 1 depicts a lithographic projection apparatus according to the invention.

FIG. 1 schematically depicts a lithographic projection apparatus according to a particular embodiment of the invention. The apparatus comprises:
- a radiation system Ex, IL, for supplying a projection beam PB of radiation (e.g. EUV radiation). In this particular case, the radiation system also comprises a radiation source LA;
- a first object table (mask table) MT provided with a mask holder for holding a mask MA (e.g. a reticle), and connected to first positioning means PM for accurately positioning the mask with respect to item PL;
- a second object table (substrate table) WT provided with a substrate holder for holding a substrate W (e.g. a resist-coated silicon wafer), and connected to second positioning means PW for accurately positioning the substrate with respect to item PL;
- a projection system ("lens") PL (e.g. a mirror group) for imaging an irradiated portion of the mask MA onto a target portion C (e.g. comprising one or more dies) of the substrate W. As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above.

The source LA (e.g. a laser-produced plasma source or a discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:
1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
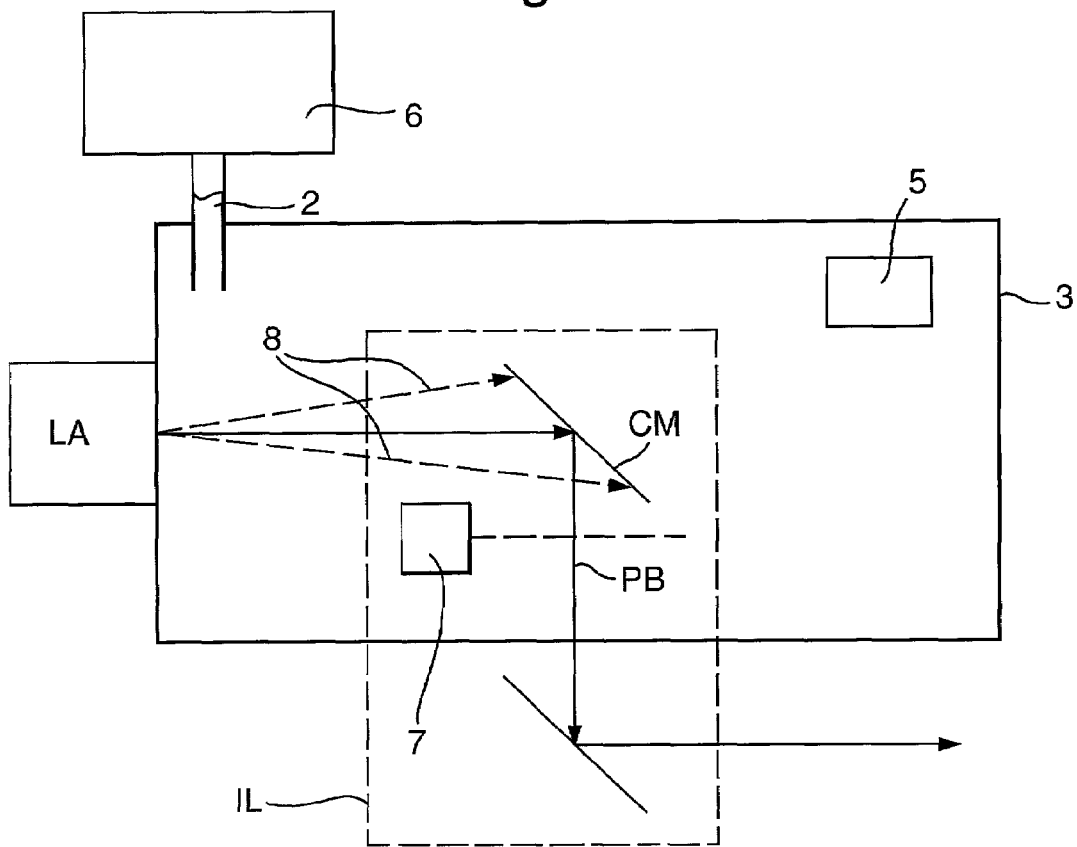
FIG. 2 depicts the radiation system of a lithographic projection apparatus according to the invention.

FIG. 2 schematically depicts the radiation system LA, IL in more detail. The source LA, as described with reference to FIG. 1, for supplying a projection beam PB of radiation is contained within a chamber 3, together with a collector mirror CM. The radiation produced by the source is reflected off the collector mirror CM and directed, as a beam PB, towards the various other optical components comprised in the illumination system IL as described above. Some of the optical components in the illumination system as here depicted are not contained within the chamber 3. However, some or all of the optical components of the illumination system IL may be contained within the chamber 3 in addition to the collector mirror CM.

The chamber 3 comprises gas supply means for supplying gaseous hydrocarbon, for example an alcohol such as ethanol, to the chamber, said means comprising a supply of the required hydrocarbon 6, which may be a cylinder of pressurized gaseous or liquid hydrocarbon, and an inlet 2 which comprises a valve. The partial pressure of the hydrocarbon in the chamber may be controlled by means of said valve. The chamber may also comprise pressure sensor means 5 for monitoring the background pressure in the chamber, and/or reflectivity sensor means 7 for monitoring the reflectivity of the collector mirror CM. Preferably, the chamber comprises both pressure and reflectivity sensor means 5 and 7. The reflectivity sensor means may monitor the reflectivity of the mirror by measuring the beam intensity along the projection beam PB or by directly measuring the reflectivity of the collector mirror.

In a specific case of the current invention, the source LA is a plasma source which produces a beam of EUV radiation PB. The plasma source also expels, in all directions, fast atoms and ions 8 and these emitted particles may come into contact with the various optical components in the chamber, in particular the collector mirror CM.

A hydrocarbon is introduced into the chamber 3 via the inlet 2 and hydrocarbon molecules adsorb to the surface of the mirror CM, thus forming a cap layer on the mirror CM. This cap layer is gradually eroded due to the impact with, or sputtering by, the fast atoms and ions produced by the plasma source. By adjusting the amount of hydrocarbon which is introduced into the chamber 3 via inlet 2, the cap layer is allowed to grow at approximately the same rate at which it is sputtered away.

The required amount of hydrocarbon can be determined using pressure and/or reflectivity sensor means 5 and 7. For example, if pressure sensor means 5 indicates that the pressure in the chamber is too low, the cap layer will be growing more slowly than it is sputtered away and the amount of hydrocarbon introduced into the chamber should be increased. Further, if reflectivity sensor means 7 indicate that the reflectivity has decreased, the cap layer will be growing more quickly than it is sputtered away and the amount of hydrocarbon introduced into the chamber should be decreased until the reflectivity once again reaches an acceptable level. It is preferable that the cap layer grows at least as quickly as it is sputtered away to ensure protection of the surface of the mirror CM. The most preferable situation is a steady-state, wherein the growth of the layer is equal to the rate at which it is sputtered away.

Embodiment 2

In a second embodiment of the invention, which is the same as the first embodiment except as described below, the hydrocarbon introduced into the chamber is an alcohol, preferably ethanol. In this case, ethanol is generally supplied at a substantially constant pressure and a self-terminating cap-layer may form on the collector mirror CM. The rate at which ethanol is introduced into the chamber must be sufficient to provide a partial pressure of ethanol in the chamber which allows the molecules which are sputtered away from the cap layer to be replaced quickly.

The minimum required partial pressure of ethanol which must be supplied to the chamber is dependent on the flux of harmful particles (e.g. xenon (Xe)) towards the mirror. The maximum flux of harmful xenon particles $$\Gamma_{Xe}^{max}$$

can be calculated as follows:

$$\Gamma_{Xe}^{max} = \frac{n_{Xe} V_{focus}}{4\pi d^2} f_{rep}$$

With $n_{Xe}$ the average xenon atom density (typically $2\times10^{24}$ m$^{-3}$), $V_{focus}$ the volume of the focus (0.025 mm$^{-3}$) of the laser beam, $f_{rep}$ the repetition rate of the source (6 kHz) and d the distance between the plasma and the mirror.

The molecular flux of ethanol $\Gamma_{eth}$ towards the mirror can be calculated as follows:

$$\Gamma_{eth} = \frac{1}{4} \frac{p_{eth}}{k_B T} \sqrt{\frac{8 k_B T}{\pi M_{eth}}}$$

With $p_{eth}$ the partial pressure of ethanol, $k_B$ the Boltzmann constant, T the absolute temperature and $M_{eth}$ the mass of ethanol. Based on the assumption that for every xenon ion or atom to hit the mirror surface a single ethanol molecule will be expelled from the cap layer, and only 0.01% of ethanol molecules adsorb to the mirror surface, in order to prevent the ethanol layer from being sputtered away, $10^{-4}\Gamma_{eth}$ must be greater than the xenon flux. Therefore for example, when the distance, d, between the plasma and the mirror is at least 10 cm, the partial pressure of ethanol must be at least $10^{-2}$ mbar.

However, if it is assumed that more than 0.01%, for example 100%, of ethanol molecules adsorb to the mirror surface, a lower partial pressure of ethanol may be used. In this case, for example, a partial pressure of ethanol of at least $10^{-6}$ mbar is required at a distance, d, of at least 10 cm.

Ideally in this embodiment, a specific partial pressure of ethanol is selected and this pressure is applied at a substantially constant rate. In this way, monitoring of the pressure and reflectivity is not required. However, it is preferred that the pressure and/or the reflectivity, preferably both, are in any case monitored as described in Embodiment 1 and adjustments to the partial pressure can be made if required. The monitoring of the partial pressure may however be less frequent and less accurate than when hydrocarbons other than an alcohol are used.

Embodiment 3

In a third embodiment of the invention, which is the same as the first embodiment except as described below with reference to FIG. 2, the mirror CM is a multilayer mirror. The multilayer mirror CM has at least 40 layers, preferably at least 50 layers and most preferably at least 60 layers.

The system comprises gas supply means 6 for supplying a hydrocarbon gas, although it is envisaged that gases other than hydrocarbons may also be used. Said means comprises a source of the required gas 6 and an inlet 2. Gas is supplied to the chamber 3 and the partial pressure of the gases in the chamber may be monitored via the sensor 5. The pressure of the gas in the system is kept high enough so that the cap layer of gaseous particles, which forms on the multilayer mirror CM, does not erode over time.

Reflectivity sensor means 7 is used to determine when the reflectance of the multilayer mirror decreases, due to the cap layer on the mirror becoming too thick. When this occurs, the pressure of the gas in the chamber can be decreased, thus causing the sputtering rate to increase. An increase in sputtering rate causes the top layer or layers of the multilayer mirror to be removed, together with the cap layer. The gas pressure in the system is then increased again to prevent further layers from being removed.

Although this embodiment only describes multilayer mirrors, it is not intended to limit the invention. One alternative is a grazing incidence mirror—mirrors onto which radiation is directed at an angle smaller than about 20 degrees—which do not necessarily comprise multilayers, but can be manufactured of a single metal layer. Such mirrors degrade as well when exposed to the atoms and ions generated by the euv radiation source. The same methods can also be applied to these mirrors.

While we have described above specific embodiments of the invention it will be appreciated that the invention may be practiced otherwise than described. The description is not intended to limit the invention.

The invention claimed is:

1. A lithographic projection apparatus comprising:
   a radiation system to supply a projection beam of radiation;
   a support structure adapted to support patterning structure which can be used to pattern the projection beam according to a desired pattern;
   a substrate table to hold a substrate;
   a projection system to project the patterned beam onto a target portion of the substrate;
   a gas supply, configured and arranged to supply a gaseous hydrocarbon to a space containing a mirror;
   at least one sensor selected from the group comprising a reflectivity sensor to monitor a reflectivity of said mirror and a pressure sensor to monitor a background pressure in said space; and
   a gas supply control to control said gas supply to control, responsive to a signal from said at least one sensor, a thickness of a layer of hydrocarbon formed on the mirror using the gaseous hydrocarbon.

2. An apparatus according to claim 1, wherein the radiation system contains said space containing the mirror.

3. An apparatus according to claim 1, wherein the radiation system comprises a laser-produced plasma source or a discharge source adapted to supply a beam of extreme ultraviolet (EUV) radiation as said projection beam.

4. An apparatus according to claim 3, wherein said beam of extreme ultraviolet radiation has a wavelength of less than about 50 nm.

5. An apparatus according to claim 4, wherein said beam of extreme ultraviolet radiation has a wavelength in the range of from 8 to 20 nm.

6. An apparatus according to claim 5 wherein said range is from 9 to 16 nm.

7. An apparatus according to claim 1, wherein the hydrocarbon is an alcohol.

8. An apparatus according to claim 7, wherein the alcohol is ethanol.

9. An apparatus according to claim 1 wherein the mirror is a collector mirror.

10. The apparatus of claim 1, wherein the gas supply control is configured to, responsive to the signal, maintain the thickness of the layer substantially constant during supply of the projection beam of radiation.

11. The apparatus of claim 1, wherein, in use, the layer of hydrocarbon is formed on the mirror by adsorption of the gaseous hydrocarbon.

12. A method of manufacturing a device using a lithographic projection apparatus comprising:
projecting a patterned beam of radiation onto a target portion of a layer of radiation-sensitive material on a substrate;
supplying a gaseous hydrocarbon to a space within the lithographic projection apparatus containing a mirror;
monitoring at least one of a reflectivity of said mirror and a background pressure in said space; and
controlling an amount of gaseous hydrocarbon supplied to said space to control, in response to the monitoring, a thickness of a hydrocarbon layer formed on the mirror using the gaseous hydrocarbon.

13. A method according to claim 12, wherein the hydrocarbon is an alcohol.

14. A method according to claim 13, wherein the alcohol is ethanol.

15. A method according to claim 12, wherein said mirror comprises at least 40 multilayers and wherein the method further comprises adapting the amount of gaseous hydrocarbon supplied to the space such that at least part of at least a top layer of said mirror undergoes sputtering.

16. The method of claim 12, comprising, responsive to the signal, maintaining the thickness of the layer substantially constant during supply of the projection beam of radiation.

17. The method of claim 12 comprising forming the layer of hydrocarbon on the mirror by adsorption of the gaseous hydrocarbon.

18. A method of manufacturing a device using a lithographic projection apparatus comprising:
projecting a patterned beam of radiation onto a target portion of a layer of radiation-sensitive material on a substrate; and
supplying a gaseous alcohol to a space in a radiation system of the lithographic projection apparatus, which space contains a mirror,
wherein the alcohol forms a cap layer on said mirror, wherein, during the projecting, particles impinge the cap layer from a source other than the cap layer and the mirror and cause particles of the cap layer to be dislodged from the cap layer by sputtering, and wherein the gaseous alcohol is supplied to said space at a pressure sufficient to achieve a thickness of said cap layer which does not increase substantially over time.

19. A method according to claim 18, wherein the alcohol is ethanol.

20. The method of claim 18 comprising forming the cap layer on the mirror by adsorption of the gaseous alcohol.

21. A lithographic projection apparatus comprising:
a support structure adapted to support patterning structure which can be used to pattern a beam of radiation according to a desired pattern;
a substrate table to hold a substrate;
a projection system to project the patterned beam onto a target portion of the substrate;
a gas supply configured to supply a gaseous hydrocarbon to a space containing a mirror; and
a gas supply control configured to control supply of the gaseous hydrocarbon to the space to maintain a layer formed on the mirror using the gaseous hydrocarbon at a substantially constant thickness in response to, during supply of the projection beam, particles of the cap layer being dislodged from the cap layer by sputtering caused by particles impinging the cap layer from a source other than the cap layer and the mirror.

22. The apparatus of claim 21, wherein the hydrocarbon comprises alcohol.

23. The apparatus of claim 21, further comprising a reflectivity sensor configured to monitor a reflectivity of the mirror, a pressure sensor configured to monitor a background pressure in the space, or both, and wherein the gas supply control is configured to, responsive to a signal from the at least one sensor, control the supply of the gaseous hydrocarbon to the space.

24. The apparatus of claim 21, wherein, in use, the layer formed on the mirror is maintained by adsorption of the gaseous hydrocarbon.

* * * * *